(12) United States Patent
Guo

(10) Patent No.: US 7,265,959 B2
(45) Date of Patent: Sep. 4, 2007

(54) SOLID STATE SWITCH WITH QUASI-PREDICTIVE SHORT CIRCUIT PROTECTION AND THERMAL PROTECTION

(75) Inventor: Sam Y Guo, Canton, MI (US)

(73) Assignee: Yazaki North America, Inc., Canton, MI (US)

( * ) Notice: Subject to any disclaimer, the term of this patent is extended or adjusted under 35 U.S.C. 154(b) by 454 days.

(21) Appl. No.: 11/043,009

(22) Filed: Jan. 25, 2005

(65) Prior Publication Data

US 2006/0164772 A1 Jul. 27, 2006

(51) Int. Cl.
*H02H 3/08* (2006.01)
(52) U.S. Cl. .................................. 361/93.1
(58) Field of Classification Search .......... 361/93.1, 361/93.5, 93.7; 324/445, 522, 654
See application file for complete search history.

(56) References Cited

U.S. PATENT DOCUMENTS

| | | | |
|---|---|---|---|
| 4,402,030 A * | 8/1983 | Moser et al. ................ 361/94 |
| 5,008,736 A | 4/1991 | Davies et al. | |
| 5,402,058 A * | 3/1995 | Larsen ....................... 323/211 |
| 5,917,399 A | 6/1999 | Ishii | |
| 6,300,818 B1 | 10/2001 | Mao | |
| 6,307,282 B1 | 10/2001 | Yu et al. | |
| 6,320,370 B1 * | 11/2001 | Weggel ................... 324/117 R |
| 6,515,840 B2 * | 2/2003 | Covi et al. ................. 361/93.1 |
| 6,654,217 B2 * | 11/2003 | Zylstra et al. ................ 361/77 |
| 6,665,591 B1 * | 12/2003 | Griepentrog et al. ....... 700/292 |
| 2003/0151860 A1 | 8/2003 | Bryan | |

* cited by examiner

*Primary Examiner*—Michael Sherry
*Assistant Examiner*—Boris Benenson
(74) *Attorney, Agent, or Firm*—Harness, Dickey & Pierce, P.L.C.

(57) ABSTRACT

A protection circuit detects short circuit and/or current overload conditions based on one of a current level and a current change rate di/dt of a current through a load. A detection device uses an inductor to detect current change rate and a resistor to detect current level, and generates a first voltage signal based on the voltages of the inductor and the resistor. A comparator generates a second voltage signal based on the voltage signal and a reference voltage signal. A switching circuit allows or interrupts current through the load based in part on the second voltage.

20 Claims, 4 Drawing Sheets

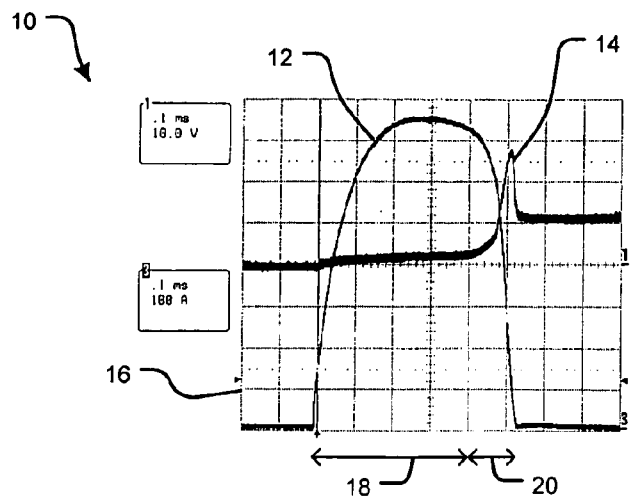
FIG. 1
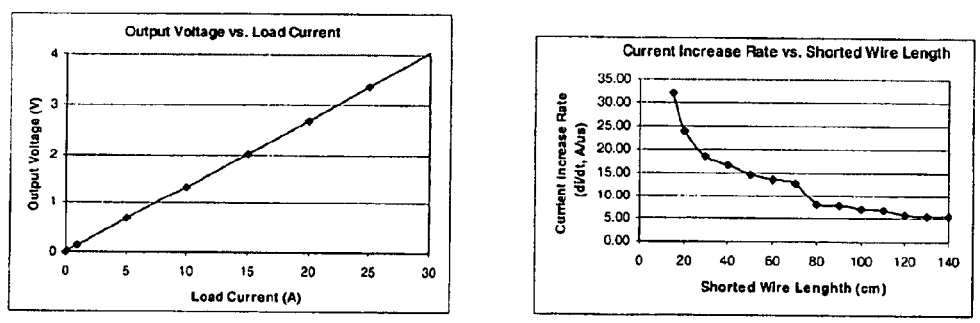
FIG. 3A          FIG. 3B

SOLID STATE SWITCH WITH QUASI-PREDICTIVE SHORT CIRCUIT PROTECTION AND THERMAL PROTECTION

FIELD OF THE INVENTION

The present invention relates to solid state electrical switches, and in particular to predictive short circuit protection for solid state electrical switches.

BACKGROUND OF THE INVENTION

Solid state electronic switches are widely used in the automotive industry because of their high speed, small size, and light weight. However, such devices are characterized by low on-resistance, which is the resistance of the device to current flow. Therefore, a large current flow through the device due to a short circuit condition can irreparably damage the device.

For low on-resistance devices, the current through the device is limited only by the resistance and inductance of the wire during a short circuit condition. As a result, the current increases substantially in a relatively short amount of time. This is especially true if the wire length is very short. Typically, electronic switches are protected by a short circuit protection circuit. Short circuit protection circuits are limited in response time, however, due to current detection delay, turn off delay, and turn off transient time. As a result, there is a delay between the detection of an over-current condition and the current interruption of the switch. In other words, in some circumstances, the current may reach a very high value before the protection circuit takes effect. Further, the short circuit current is inversely proportional to the length of the shorted wire.

A short circuit current waveform 10 for an exemplary electronic switch having a maximum rated current of 60 amps, an on-resistance of 2 mΩ, and a trip current set at 100 amps is shown in FIG. 1. The waveform 10 is exemplary of an electronic switch that utilizes conventional short-circuit protection. A short circuit protection circuit monitors the level of the current 12 flowing through the device. Voltage 14 is the voltage across the device. The protection circuit generates a shutoff signal if the current level 12 exceeds the trip current level 16 of 100 amps. However, the protection circuit does not generate the shutoff voltage signal until the current level 12 is above the trip current level 16 for tens of microseconds. This delay is referred to as a detection delay 18. Subsequently, after the protection circuit generates the shutoff voltage signal 14, additional time elapses. This delay is referred to as a turn-off delay 20. Therefore, it can be seen that the conventional short circuit protection did not adequately protect the device from exposure to high current. Because the current increase rate di/dt is very high during a short circuit condition, it is possible for the current level 12 to exceed 750 amps, despite having a trip current level 16 of 100 amps.

SUMMARY OF THE INVENTION

A short circuit and current overload protection circuit comprises a detection device that determines a current level and a current change rate of a current through a load and generates a voltage signal that is indicative of the current level and/or the current change rate. A load condition device receives the voltage signal and generates a switching signal that is a first value if the voltage signal is at or above a threshold and is a second value if the voltage signal is below the threshold. A switching device receives the switching signal and one of allows the current through the load and/or interrupts the current through the load according to the first or second value.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 1 illustrates response of a short circuit protection circuit according to the prior art;

FIG. 3A illustrates output voltage of a current detection circuit versus load current according to the present invention;

FIG. 3B illustrates current change rate versus shorted wire length according to the prior art;

DETAILED DESCRIPTION OF THE PREFERRED EMBODIMENTS

The following description of the preferred embodiment(s) is merely exemplary in nature and is in no way intended to limit the invention, its application, or uses.

Figure 2:
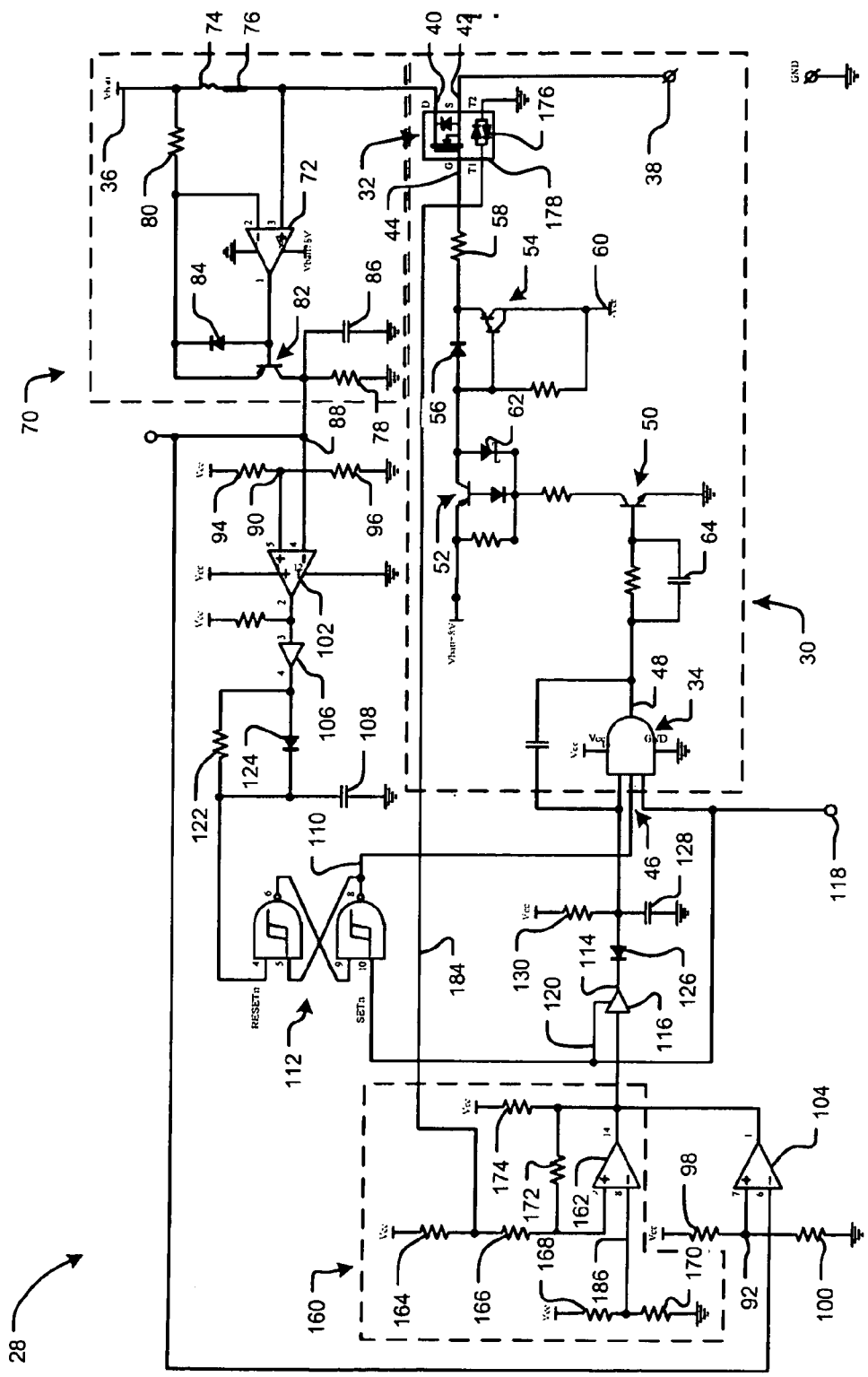
FIG. 2 is a schematic of a short circuit and thermal protection circuit according to the present invention.

The present invention provides overload protection based on current level and provides short circuit protection based on current change rate di/dt. The overload and short circuit prevention circuit 28 includes a switching circuit 30, which further includes a power transistor 32, an AND gate 34, a voltage source 36, and a load 38 as shown in FIG. 2. The power transistor 32 controls the current flow from the voltage source 36 to the load 38. The voltage source 36 communicates with a drain node 40 of the power transistor 32. The load 38 communicates with a source node 42 of the power transistor 32. The AND gate 34 communicates with a gate node 44 of the power transistor 32. If the power transistor 32 is in an "on" state, current flows from the voltage source 36, through the power transistor 32, to the load 38. If the power transistor is in an "off" state, the power transistor 32 interrupts the current flow from the voltage source 36 to the load 38.

The AND gate 34 controls the "off" or "on" status of the power transistor 32. The AND gate 34 receives one or more inputs 46 and generates an output 48. If the output 48 is high, transistors 50 and 52 are "on," transistor 54 is "off," and diode 56 is conducting current. As a result, the input capacitance of the power transistor 32 is charged, and the power transistor 32 is "on." If the output 48 is low, transistors 50 and 52 are "off," transistor 54 is "on," and diode 56 is inversely biased by the charge stored in the input capacitance of the power transistor 32. As a result, the charge is pulled put of the power transistor 32 through resistor 58 and the transistor 54 to a negative power supply 60, and the power transistor 32 is "off." Therefore, if all of the inputs 46 are high, the output 48 is high and the power transistor 32 is "on." Conversely, if one or more of the inputs 46 are low, the output 48 is low and the power transistor 32 is "off." Additional electrical components may be included to provide improved functionality as is known in the art. For example, diode 62 reduces the "off" delay of transistor 52, and capacitor 64 decreases the "on" and "off" response time of transistor 50.

The protection circuit 28 includes a detection circuit 70. The detection circuit 70 includes a general purpose operational amplifier 72, a detection inductor 74, a detection resistor 76, resistors 78 and 80, transistor 82, diode 84, and capacitor 86. The detection circuit 70 detects both a load current change rate di/dt and a current level of the current flow from the voltage source 36 to the load 38. The current flow from the voltage source 36 to the load 38 will hereinafter be referred to as the "load current." When there is no load current, transistor 82 is "off" and the output voltage at node 88 is zero. The output voltage at node 88 is an analog voltage representing the load current. When the load current is not zero, there is a small voltage drop across the detection inductor 74 and the detection resistor 76. The gain of the operational amplifier 72 amplifies the effect of the voltage drop, causing transistor 82 to conduct current. As a result, a small amount of current flows from the voltage source 36, through resistor 80, transistor 82, and resistor 78. The resultant voltage drop across resistor 80 balances the voltage drop across the detection inductor 74 and the detection resistor 76. The resultant voltage across resistor 78 is used by the protection circuit 28 for load current measurement. The diode 84 prevents transistor 82 from being deeply reverse biased, thus increasing the current detection speed.

FIG. 3A illustrates the linearity between the load current and the output voltage 88 (i.e. the voltage at node 88). As the load current increases, the output voltage increases proportionately and linearly. For over load conditions, the current change rate di/dt is usually below 1.5 amps per µs. However, for short circuit conditions, the current change rate is much higher, such as 10 amps per µs. The current change rate for short circuit conditions is dependent upon the length of the shorted wire as shown in FIG. 3B.

The detection inductor 74 and the detection resistor 76 are relatively small in value, such as 0.1 mΩ. In the preferred embodiment, the detection inductor 74 and the detection resistor 76 are formed with a short segment of a copper trace on a printed circuit board (PCB). A ratio of the values of the detection inductor 74 and the detection resistor 76 is selected such that under an over load condition, the output voltage generated due to the current change rate di/dt is smaller than the voltage across the detection resistor 76. Conversely, under a short circuit condition, the output voltage due to the current change rate di/dt is larger than the voltage across the detection resistor 76. Because there is a large current change rate di/dt difference between an overload condition and a short circuit condition, this comparison is easily effectuated.

The detection circuit 70 determines the state of the switching circuit 30 as follows. Under normal load conditions, the output voltage at node 88 is lower than both a voltage reference 90 and a voltage reference 92. Voltage reference 90 is determined by resistors 94 and 96. Voltage reference 92 is determined by resistors 98 and 100. The values of resistors 94, 96, 98, and 100 are selected such that voltage reference 90 is lower than voltage reference 92. Therefore, under normal load conditions, the outputs of comparators 102 and 104 are high, and the output of buffer 106 is high, charging capacitor 108 to $V_{cc}$.

The inputs 46 of the AND gate 34 are determined according to an output 110 of a latch 112, an output 114 of a buffer 116, and a control input 118. Although the latch 112 is shown as an active-low RS latch, it is possible to use other latches as are known in the art to accomplish analogous functionality. The output 114 of the buffer 116 is a three-state output. The control input 118 communicates with the AND gate 34, an output control 120 of the buffer 116, and the latch 112.

As load current increases, the output voltage 88 increases accordingly. When the output voltage 88 exceeds voltage reference 90 but is lower than voltage reference 92, the output of comparator 102 changes from high to low, causing capacitor 108 to discharge through resistor 122. As a result, the voltage input to the latch 112 decreases until the output 110 of the latch 112 becomes low, and the AND gate 34 turns off the power transistor 32. With the power transistor 32 "off," the load current is interrupted, and the output voltage 88 drops to zero. The outputs of comparators 102 and 104 return to high, and capacitor 108 is charged rapidly through diode 124. The low to high change of the RESETn input of the latch 112 does not cause the state of the output 110 to change. Therefore, the output 110 of the latch 112 is still low. As a result, the transistor 32 remains "off" after the RESETn input changes back to high. In order for the output 110 to change from low to high, the SETn input of the latch 112 must be toggled. In other words, the control input 118 must change from high to low, then from low to high. Therefore, when the output voltage 88 exceeds voltage reference 90 but is lower than voltage reference 92, the power transistor 32 is not turned off immediately. Instead, there is a delay referred to as "blank time" due to the slow discharge of capacitor 108. The blank time is useful in applications wherein the load has a temporary large inrush current, such as a motor. The length of the blank time is determined by the time constant of capacitor 108 and resistor 122. In other words, the longer it takes the capacitor to discharge, the longer the blank time. After the blank time elapses, the output 110 of the latch 112 changes to low, turning of the power resistor 32.

For large overload current or short circuit current, the output voltage 88 exceeds both voltage references 90 and 92. The outputs of both comparator 104 and buffer 116 change to low, and the AND gate 34 immediately turns off the power transistor 32. The output voltage 88 drops to zero, causing the outputs of the comparator 104 and the buffer 116 to return to high, and diode 126 is inversely biased. Capacitor 128 is charged through resistor 130. When the voltage of capacitor 128 becomes higher than a threshold of the AND gate 34, the output of the AND gate 34 returns to high and turns the power transistor 32 on. If the current overload or short circuit condition is still present, the process repeats. When the load condition becomes normal, the circuit resumes normal function.

Figure 4A:
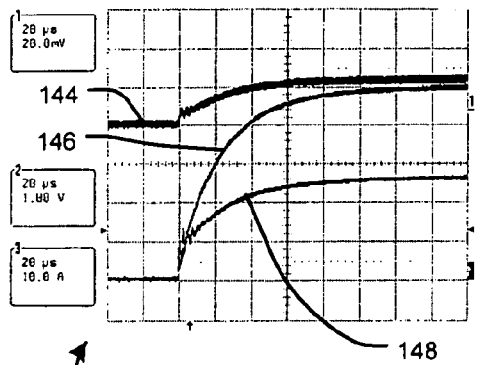
FIG. 4A illustrates output of the detection circuit during normal load conditions according to the present invention.
Figure 4B:
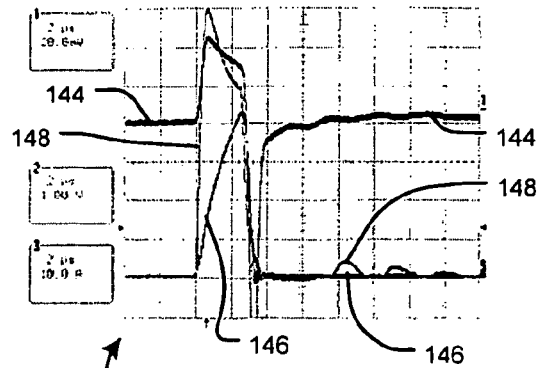
FIG. 4B illustrates output of the detection circuit during a short circuit condition according to the present invention.

FIGS. 4A and 4B illustrate the operation of the protection circuit 28 under normal load 140 and short circuit 142 conditions. Referring now to FIG. 4A, the current sensor voltage 144 indicates voltage across the detection inductor and resistor, the current monitor voltage 148 indicates the output voltage, and the load current signal 146 indicates the load current level. Under normal conditions, the current sensor voltage 144 and the current monitor voltage 148 follow the shape of the load current 146. Referring now to FIG. 4B, under a short circuit condition the current sensor voltage 144 and/or the current monitor voltage 148 does not follow the shape of the load current 146. For example, when the current sensor voltage 144 or the current monitor voltage 148 is at its peak value, the load current signal 146 is not at peak value. Instead, the load current signal 146 is at its lowest value. In other words, when a short circuit occurs, the maximum current change rate di/dt occurs at the beginning of the short circuit. As a result, transistor 32 is turned off at the beginning of the short circuit condition, rather than waiting for the current to increase to the threshold level. In theory, transistor 32 should be turned off when the load current is substantially zero. However, in practice, when transistor 32 is turned off, the load current reaches a small value due to the turn off delay.

Figure 5:
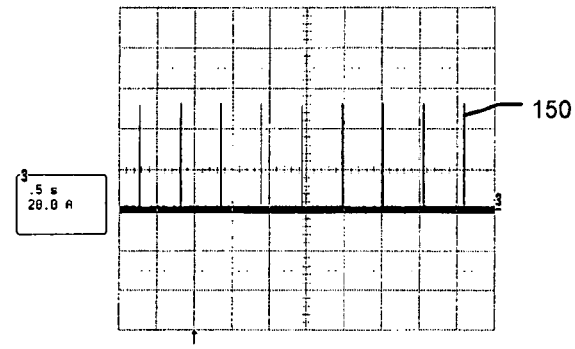
FIG. 5 illustrates current level pulses during repeated short circuit conditions according to the present invention.

In a short circuit condition, the load current signal 146 will pulse as the protection circuit 28 repeatedly turns the power transistor 32 off and on repeatedly as shown in FIG. 5. The current pulses 150 will repeat approximately every 0.5 seconds. For each pulse, the energy dissipation by the load is approximately 185 μJ, resulting in an average power dissipation of 185 μJ per second, or 370 μW. Therefore, the energy and power dissipation is substantially lower than using conventional overload or short circuit protection methods.

Figure 6A:
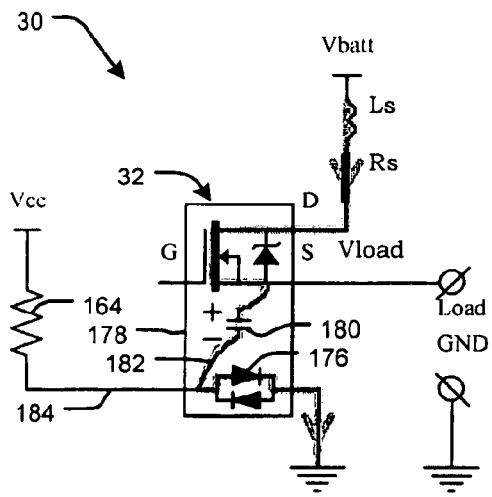
FIG. 6A is a schematic of a switching circuit incorporating a thermal sensor when the switch is "on" according to the present invention.
Figure 6B:
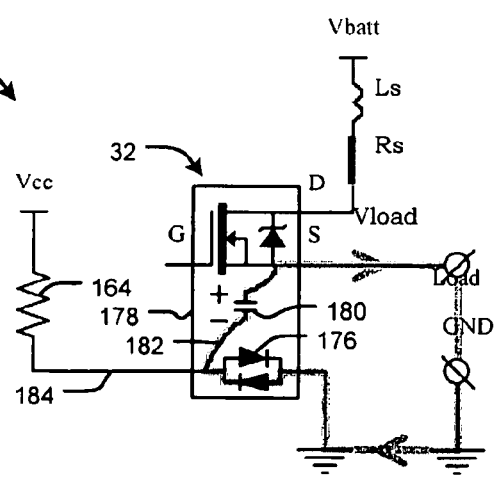
FIG. 6B is a schematic of a switching circuit incorporating a thermal sensor when the switch is "off" according to the present invention.

Referring to FIG. 2, the protection circuit 28 may also include a thermal protection circuit 160. The thermal protection circuit 160 includes an comparator 162 and resistors 164, 166, 168, 170, 172, 174. The thermal protection circuit 160 operates in conjunction with a temperature sensor diode 176 built into the die 178 of the power transistor 32 as shown in FIGS. 6A and 6B. As temperature increases, the forward bias voltage of the temperature sensor diode 176 decreases linearly with the increase of temperature. Because the distance between the diode 176 and die 178 is very small, the temperature response time of the diode 176 is very fast. However, a significant parasitic capacitance 180 between the diode 176 and the die 178 is formed due to the small distance, resulting in a dv/dt sneak path 182. Under static conditions, the power transistor 32 is either on or off and the load voltage change rate dv/dt is zero. In this case, the parasitic capacitance 180 has no adverse effect on the operation of the circuit. The thermal sensor output voltage 184 is approximately 0.7 volts at room temperature. As temperature of the die 178, and therefore the diode 176, increases, a thermal sensor output voltage 184 of the diode 176 decreases. If the thermal sensor output voltage 184 decreases below a thermal voltage reference 186 (as shown in FIG. 2), the outputs of both comparator 162 and buffer 114 change to low, and the power transistor 32 is turned off. As the power transistor 32 cools, the thermal sensor output voltage 184 increases until it exceeds the thermal voltage reference 186 and the capacitor 128 is charged sufficiently to turn the power transistor 32 back on. Resistor 172 is used to set thermal hysteresis of the thermal protection circuit 160.

During the "on" transient, the load voltage changes from zero to the voltage of the source 36, and dv/dt is larger than zero, charging the parasitic capacitor 180. The charging current flows through the dv/dt sneak path 182. As a result, the thermal sensor output voltage 184 briefly increases from 0.7 volts to 0.8 volts due to the charging current. This voltage increase will not shut off the transistor 32 erroneously. During the "off" transient, the load voltage changes from the voltage of the source 36 to zero, and dv/dt is less than zero. The parasitic capacitance 180 is discharged through a discharge sneak path 188. The discharging current causes the thermal sensor output voltage 184 to decrease briefly from 0.7 volts to −0.8 volts, which is less than the thermal voltage reference 186. Therefore, the output of comparator 162 becomes low erroneously. To prevent capacitor 128 from being discharged by the erroneous signal, the buffer 116 is connected between the comparator 162 and the diode 126. The control input 118 is connected to the output enable input 120 of the buffer 116. When the control input 118 is high, the buffer 116 is enabled, and either an overheat signal from the comparator 162 or an over current signal from comparator 104 can pass through the buffer 116 to the diode 126, allowing the protection circuit 28 to perform normal protection functions. When the control input 118 is low, transistor 32 is turned off, the load 38 is disconnected from the source 36, and the buffer 116 is disabled. The erroneous "off" signal resulting from the parasitic capacitance 180 therefore cannot pass through the buffer 116 when the control input 118 is low. Therefore, capacitor 128 is not discharged by the erroneous "off" signal. If capacitor 128 were discharged by the erroneous signal, the load switch could not be turned on immediately after the erroneous signal was gone because it took a long time for capacitor 128 to be charged high again. If the control signal were PWM signal, many PWM pulses would be missed due to the charging time of capacitor 128 after the erroneous signal was gone.

Figure 7:
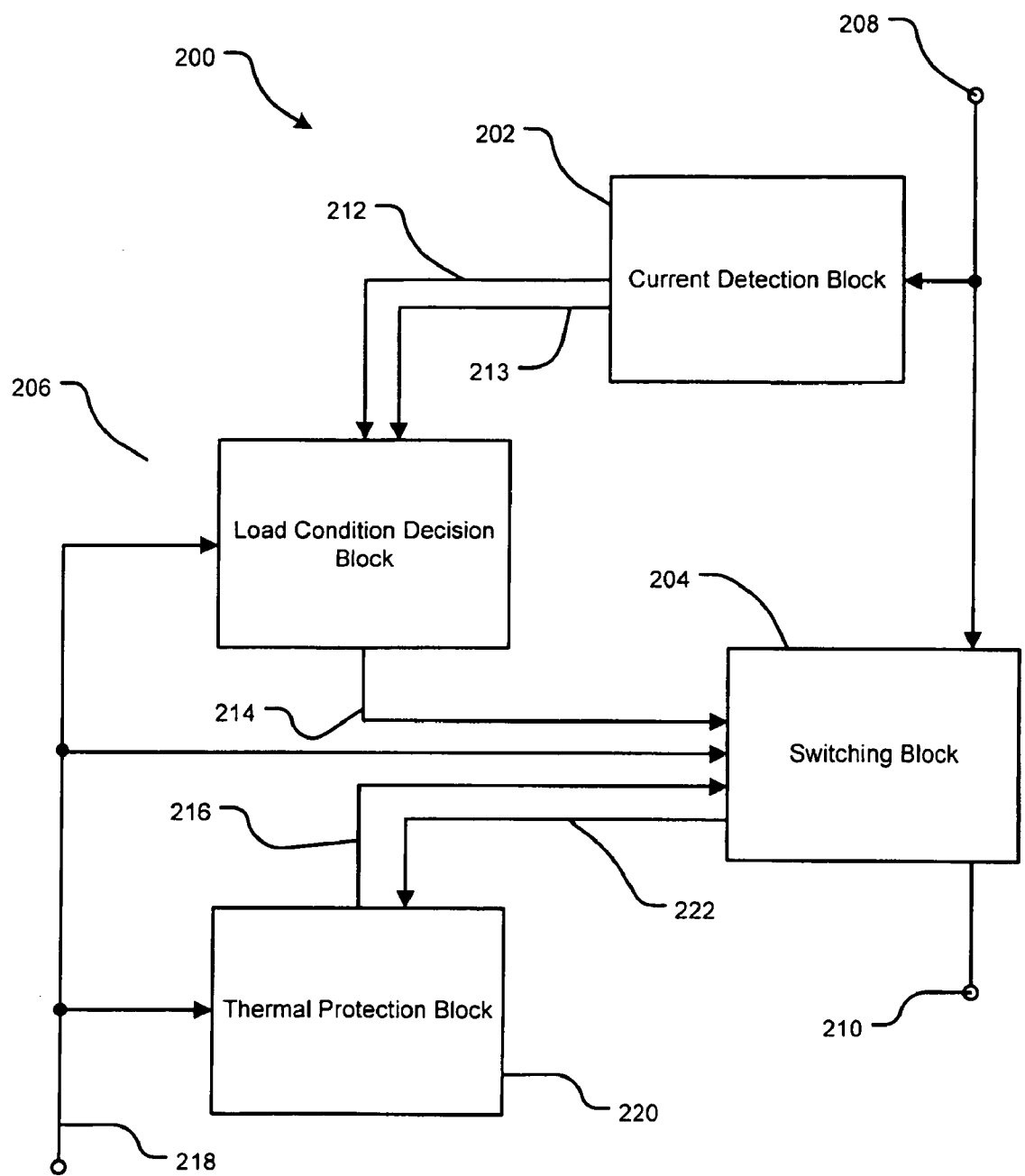
FIG. 7 is a functional block diagram of the protection circuit according to the present invention.

A functional block diagram of a protection circuit 200 according to the description above is shown in FIG. 7. The protection circuit 200 includes a current detection block 202, a switching block 204, and a load condition decision block 206. The current detection block 202 monitors current flow from a source node 208, through the switching block 204, to a load 210. The current detection block 202 outputs a current level signal 212 that is indicative of the current flow and a current di/dt level 213 that is indicative of current change rate. The load condition decision block 206 receives the current level signal 212 and the current di/dt level signal 213. The load condition decision block 206 generates a switch control signal 214 based on the current level signal 212 and the current di/dt level signal 213. The switching block 204 either prevents current flow from the source node 208 to the load 210 or allows current flow from the source node 208 to the load 210 based on the switch control signal 214. For example, the current detection block 202 detects the current level and the current di/dt level. If either the current level signal 212 or the current di/dt level 213 is above a threshold, the load condition decision block 206 outputs a switch control signal 214 at a first value, causing the switching block 204 to prevent current flow. If both the current level signal 212 and the current di/dt level 213 are at or below the threshold, the load condition decision block 206 outputs a switch control signal 214 at a second value, causing the switching block 204 to allow current flow.

Further, the protection circuit 200 may include additional inputs, such as a thermal protection signal 216 and/or a control input signal 218. A thermal protection block 220 generates the thermal protection signal 216 based on a switch temperature signal 222. If the switch temperature signal 222 is above a threshold, the thermal protection block 220 communicates the thermal protection signal 216 at a first value to the switching block 204. If the switch temperature signal 222 is at or below the threshold, the thermal protection block 220 communicates the thermal protection signal 216 at a second value to the switching block 204. Therefore, the thermal protection block 220 also determines the operation of the switching block 204.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A short circuit and current overload protection circuit comprising:
    a detection device that determines a current level and a current change rate of a current through a load and generates a voltage signal that is indicative of the current level and/or the current change rate;
    a load condition device that receives the voltage signal and generates a switching signal that is a first value if the voltage signal is at or above a threshold and is a second value if the voltage signal is below the threshold; and
    a switching device that receives the switching signal and one of allows the current through the load and/or interrupts the current through the load according to the first or second value.

2. The protection circuit of claim 1 wherein the detection device communicates with a voltage source and the load and determines the current level and the current change rate according to current flow from the voltage source to the load.

3. The protection circuit of claim 1 wherein the detection device includes an inductor and a resistor, and the current passes through the inductor and the resistor.

4. The protection circuit of claim 3 wherein a voltage of the resistor is indicative of the current level and a voltage of the inductor is indicative of the current change rate.

5. The protection circuit of claim 4 wherein the current level is indicative of a current overload condition and the current change rate is indicative of a short circuit condition.

6. The protection circuit of claim 5 wherein the voltage signal is indicative of a current overload condition if the voltage of the inductor is less than the voltage of the resistor, and the voltage signal is indicative of a short circuit condition if the voltage of the inductor is greater than the voltage of the resistor.

7. The protection circuit of claim 1 wherein the load condition device includes a comparator that receives the voltage signal and a first voltage reference signal that is indicative of the threshold, and generates a latch control signal according to the voltage signal and the first voltage reference signal.

8. The protection circuit of claim 7 wherein the load condition device includes a latch that outputs the switching signal according to the latch control signal.

9. The protection circuit of claim 1 wherein the switching device includes a transistor that is in one of an "off" and/or "on" state according to the switching signal.

10. The protection circuit of claim 9 wherein the switching device further comprises a logic gate that receives the switching signal and generates a switch control signal according to the switching signal.

11. The protection circuit of claim 10 wherein the transistor receives the switch control signal.

12. The protection circuit of claim 1 further comprising a thermal protection device.

13. The protection circuit of claim 12 wherein the switching device includes a temperature sensor that generates a temperature signal indicative of a temperature of the switching device.

14. The protection circuit of claim 13 wherein the thermal protection device receives the temperature signal and generates a temperature switching signal that is a first value if the temperature signal is above a temperature threshold and is a second value if the temperature signal is below the temperature threshold.

15. The protection circuit of claim 14 wherein the switching device receives the temperature switching signal.

16. The protection circuit of claim 14 wherein the thermal protection device includes a comparator that receives the temperature signal and a temperature reference voltage signal.

17. A short circuit and current overload protection circuit comprising:
    a detection device that includes:
        a resistance element that outputs a first voltage signal indicative a resistance element and an inductance element that collectively output a first voltage signal indicative of a current level of a current through a load and a current change rate of the current through the load; and
        the first voltage signal and generates a latch control signal that is indicative of the voltagereference signal and the first voltage signal and generates
    a latch that receives the latch control signal and outputs a switching signal according to the latch control signal; and
    a switching device including a transistor that receives the switching signal and one of allows the current through the load and/or interrupts the current through the load according to the switching signal.

18. A short circuit and current overload protection method comprising:
    determining a current level and a current change rate of a current through a load;
    generating a voltage signal that is indicative of the current level and/or the current change rate;
    generating a switching signal that is a first value if the voltage signal is at or above a threshold and is second value if the voltage signal is below the threshold; and
    allowing and/or interrupting the current through the load according to the first or second value.

19. The method of claim 18 wherein the step of determining includes communicating with a voltage source and the load and determining the current level and the current change rate according to the current flow from the voltage source to the load.

20. The method of claim 18 wherein the step of generating the switching signal includes generating a latch signal indicative of the voltage signal and generating the switching signal according to the latch signal.

* * * * *

UNITED STATES PATENT AND TRADEMARK OFFICE
CERTIFICATE OF CORRECTION

PATENT NO. : 7,265,959 B2  
APPLICATION NO. : 11/043009  
DATED : September 4, 2007  
INVENTOR(S) : Sam Y. Guo Page 1 of 1

It is certified that error appears in the above-identified patent and that said Letters Patent is hereby corrected as shown below:

Column 8, Lines 24 & 25, After "resistance element" Delete "that outputs a first voltage signal indicative a resistance element".

Column 8, Line 29, After "the load; and" should have been inserted

--a load condition device that includes:

a comparator that receives a voltage reference signal and--.

Column 8, Line 31, After "of the" "voltagereference" should be --voltage reference--.

Signed and Sealed this

Fifteenth Day of April, 2008

JON W. DUDAS  
*Director of the United States Patent and Trademark Office*